(12) United States Patent
Igarashi

(10) Patent No.: US 6,337,592 B1
(45) Date of Patent: Jan. 8, 2002

(54) NON-VOLATILE SEMICONDUCTOR SWITCH CIRCUIT

(75) Inventor: Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/695,062

(22) Filed: Oct. 25, 2000

(30) Foreign Application Priority Data

Apr. 24, 2000 (JP) ............................................. 12-121893

(51) Int. Cl.⁷ .............................................. H03K 17/687

(52) U.S. Cl. .......................... 327/427; 327/545; 365/65

(58) Field of Search .................................. 327/427, 434, 327/436, 437, 545; 365/65, 117, 145

(56) References Cited

U.S. PATENT DOCUMENTS 5,999,439 A * 12/1999 Seyyedy ..................... 365/145
6,188,599 B1 * 2/2001 Kang .......................... 365/145
6,198,654 B1 * 3/2001 Ashikaga ................... 365/145

FOREIGN PATENT DOCUMENTS

JP          3-150796        6/1991

* cited by examiner

Primary Examiner—Tuan T. Lam
Assistant Examiner—Hiep Nguyen
(74) Attorney, Agent, or Firm—Volentine Francos, PLLC

(57) ABSTRACT

A semiconductor switch circuit that assuredly preserves a switch condition when a power supply is turned off. When a first signal is set to "L" and a second signal is set to "H" and a control signal of VCC/2 is applied, a first ferroelectric capacitor and a second ferroelectric capacitor connect to a first control terminal and a second control terminal, respectively, and signals at the control terminals are stored as polarization states in the ferroelectric capacitors. After this storage, the second signal is set to "L", the ferroelectric capacitors disconnect from the control terminals and terminals of the ferroelectric capacitors are short-circuited. Consequently, imprint effects are prevented and polarizations are assuredly preserved. To read out stored information, a power supply for two inverters is disconnected, the control signal of VCC/2 is applied, and the first and second signals are set to "H". Hence, a potential difference corresponding to the polarization states of the ferroelectric capacitors is output at the control terminals. Then, when the power supply for the two inverters is connected, the original switch condition is reproduced.

20 Claims, 8 Drawing Sheets

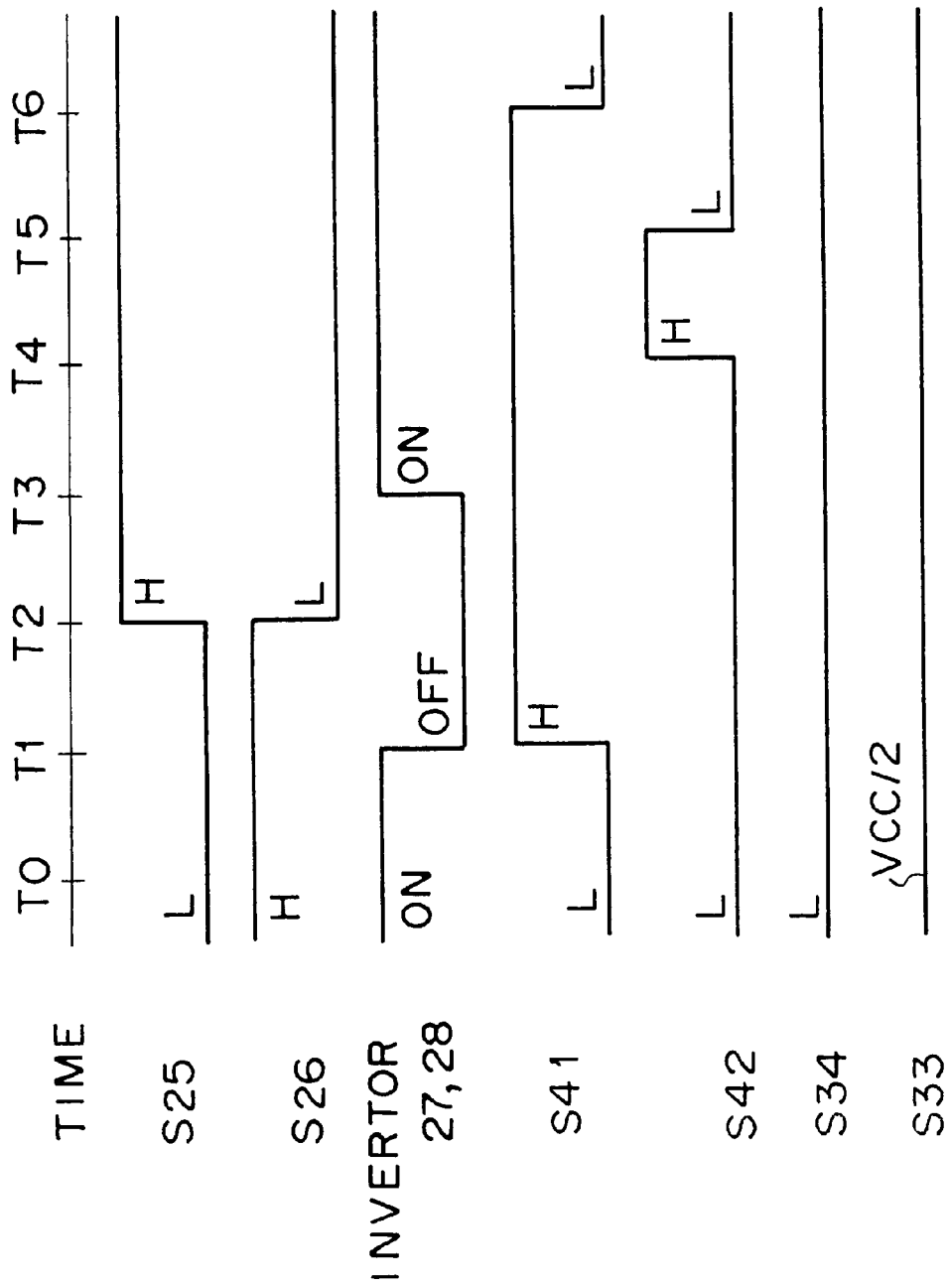

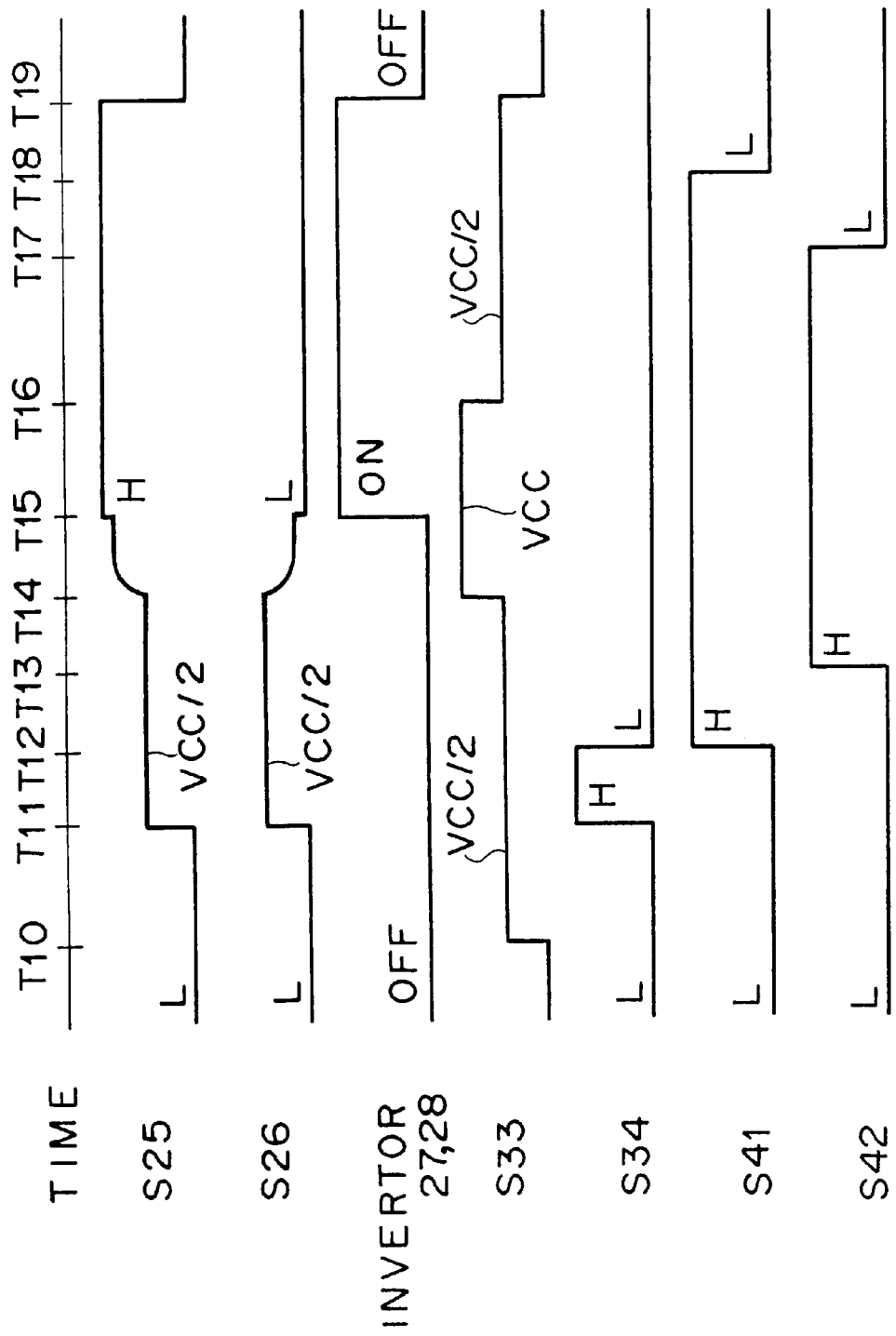

US 6,337,592 B1

NON-VOLATILE SEMICONDUCTOR SWITCH CIRCUIT

BACKGROUND OF THE INVENTION

1. Field of the Invention

The present invention relates to a non-volatile semiconductor switch circuit which can store an ON/OFF state after a power supply has been disconnected, and reproduce that original state when the power supply is reconnected.

2. Description of the Related Art

The invention described in the following Reference serves as an example of conventional technology in the field of the present invention.

Reference: Japanese Patent Application Laid-Open (JP-A) No. 3-150796

FIG. 2 is a circuit diagram of a conventional non-volatile semiconductor switch circuit, as described in the Reference.

In this non-volatile semiconductor switch circuit, a P-channel MOS transistor 3 (hereinafter called a "PMOS") and an N-channel MOS transistor 4 (hereinafter called an "NMOS") are connected between input/output terminals 1 and 2. The PMOS 3 and the NMOS 4 control an ON/OFF connection condition between the input/output terminals 1 and 2. Gates of the PMOS 3 and the NMOS 4 are connected to control terminals 5 and 6 respectively.

A flip-flop formed by inverters 7 and 8 is connected at the control terminals 5 and 6. That is, an input of the inverter 7 is connected to the control terminal 5 and an output of the inverter 7 is connected to the control terminal 6, while an input of the inverter 8 is connected to the control terminal 6 and an output of the inverter 8 is connected to the control terminal 5.

Respective one terminals of ferroelectric capacitors 9 and 10 are connected to the control terminals 5 and 6. Respective other terminals of the ferroelectric capacitors 9 and 10 are connected to a control terminal 11. The ferroelectric capacitors 9 and 10 are also connected to a substrate potential VSS via capacitors 12 and 13, respectively.

FIG. 3 shows a hysteresis characteristic of a ferroelectric capacitor. The horizontal axis represents applied voltage and the vertical axis represents a polarization within the ferroelectric capacitor that results from application of voltage. A hysteresis curve is shown by solid line A in FIG. 3. For example, if a positive voltage exceeding a certain value is applied and then the applied voltage returns to 0 V, a positive polarization persists at the ferroelectric capacitor. Further, if a negative voltage exceeding a certain value is applied and then the applied voltage returns to 0 V, a negative polarization persists at the ferroelectric capacitor. Hence, the state of the voltage most recently applied to the ferroelectric capacitor can be preserved by the persisting polarization state.

Operation of the non-volatile semiconductor switch circuit of FIG. 2 is performed as described below.

A control pulse at the substrate potential VSS is applied to the control terminal 5 and a control pulse at a power supply voltage VCC is applied to the control terminal 6. Hence, the PMOS 3 and the NMOS 4 both turn on, and there is an ON condition between the input/output terminals 1 and 2. Also, the levels of the control pulses applied to the control terminals 5 and 6 are retained at the inverters 7 and 8. Even after the control pulses are removed, the ON condition between the input/output terminals 1 and 2 is maintained. Then, when a driving pulse at a level of half of the power supply voltage VCC is applied to the control terminal 11, a voltage of +VCC/2 is applied across the terminals of the ferroelectric capacitor 9 and a voltage of −VCC/2 is applied across the terminals of the ferroelectric capacitor 10. When the driving pulse is subsequently removed, polarizations persist at the ferroelectric condensers 9 and 10 in accordance with the voltage of the applied driving pulse.

Thus, when the power supply for the non-volatile semiconductor switch circuit is disconnected, the control pulse condition retained by the inverters 7 and 8 is lost. However, even after disconnection of the power supply, the polarization states of the ferroelectric capacitors 9 and 10 are preserved.

Then, when the power supply for the non-volatile semiconductor switch circuit is to be reconnected, a voltage of VCC/2 is applied to the control terminal 11 before the power supply is turned on. Thus, voltages corresponding to the polarization states preserved at the ferroelectric capacitors 9 and 10 are output at the one terminals of the ferroelectric capacitors 9 and 10, and the control terminals 5 and 6 are brought to potential levels substantially the same as the most recent levels before the power supply was disconnected. In this condition, the power supply is connected, the inverters 7 and 8 are set by a potential difference between the control terminals 5 and 6, and the condition of the circuit before the power supply was disconnected is reproduced.

Because the ferroelectric capacitors preserve polarizations caused by applied voltages, they can store information. When information is rewritten, it is necessary to reverse the polarizations. As the solid line A in FIG. 3 shows, ferroelectric capacitor hysteresis curves usually have point symmetry with respect to a 0 V applied voltage.

However, if a voltage is applied to a ferroelectric capacitor for a long time, an effect known as "imprinting" occurs, by which the hysteresis curve is displaced along the applied voltage axis, as shown, for example, by dotted line B in FIG. 3. When the hysteresis characteristic has been changed in the manner of the dotted line B by imprinting, preserving positive polarization is more difficult than it was with the original hysteresis characteristic of the solid line A, and a larger voltage must be applied in order to reverse a negative polarization. When there is charge at both electrodes of a ferroelectric capacitor, electric fields are generated in the ferroelectric material, and imprinting tends to occur.

When the power supply to the non-volatile semiconductor switch circuit of FIG. 2 is disconnected, because the terminals of the ferroelectric capacitors 9 and 10 are not directly connected to each other, it is not possible to set the voltage thereacross to 0 V. Consequently, there are electric fields in the ferroelectric capacitors 9 and 10 and, if the power supply is continuously disconnected for a long time, imprinting is likely to occur and it will be difficult to maintain the stored information.

SUMMARY OF THE INVENTION

The present invention is provided to solve the above-described problems of conventional technology, and an object of the present invention is to provide a non-volatile semiconductor switch circuit that can assuredly preserve a condition from before disconnection of a power supply even when the power supply is continuously disconnected for a long time.

A first aspect of the present invention is a non-volatile semiconductor switch circuit having: a signal preservation section for preserving complementary control signals generated in accordance with a first potential and a second potential which are applied at a first control terminal and a second control terminal respectively; a switch section connected to the signal preservation section and formed by complementary transistors between a first input/output terminal and a second input/output terminal for switching between an on state and an off state in response to the control signals; a first ferroelectric capacitor connected between the first control terminal and a third control terminal for generating a polarization state in accordance with a potential difference between the first and third control terminals when a third potential is applied at the third control terminal and for preserving the polarization state after the first and third potentials have been removed; a second ferroelectric capacitor connected between the second and third control terminals for generating a polarization state in accordance with a potential difference between the second and third control terminals when the third potential is applied at the third control terminal and for preserving the polarization state after the second and third potentials have been removed; a first short section connected in parallel with the first ferroelectric capacitor for placing input/output terminals of the first ferroelectric capacitor in a short-circuited state when a preservation signal is applied; and a second short section connected in parallel with the second ferroelectric capacitor for placing input/output terminals of the second ferroelectric capacitor in a short-circuited state when the preservation signal is applied.

When the third potential is applied to the third control terminal and the preservation signal is applied to the first and second short sections such that the input/output terminals of the first and second ferroelectric capacitors are in short-circuited states, programming of the switch section is performed by applying the first and second potentials at the first and second control terminals, respectively, to thereby operate the signal preservation section and by temporarily stopping the preservation signal to thereby temporarily release short-circuited states of the first and second ferroelectric capacitors.

Further, when the third potential is applied to the third control terminal and the preservation signal is stopped such that short-circuited states of the first and second ferroelectric capacitors are released, a state of the switch section recorded by programming is read out by applying a potential, which is higher than the third potential, at the third control terminal to thereby operate the signal preservation section.

The first and second short sections are each formed by one of an enhancement-type field effect transistor and a depletion-type field effect transistor.

A second aspect of the present invention is a non-volatile semiconductor switch circuit having: a signal preservation section for preserving complementary control signals generated in accordance with a first potential and a second potential which are applied at a first control terminal and a second control terminal respectively; a switch section connected to the signal preservation section and formed by complementary transistors between a first input/output terminal and a second input/output terminal for switching between an on state and an off state in response to the control signals; a first ferroelectric capacitor connected between the first control terminal and a third control terminal for generating a polarization state in accordance with a potential difference between the first and third control terminals when a third potential is applied at the third control terminal and for preserving the polarization state after the first and third potentials have been removed; a second ferroelectric capacitor connected between the second and third control terminals for generating a polarization state in accordance with a potential difference between the second and third control terminals when the third potential is applied at the third control terminal and for preserving the polarization state after the second and third potentials have been removed; a first short section connected in parallel with the first ferroelectric capacitor for placing input/output terminals of the first ferroelectric capacitor in a short-circuited state when a preservation signal is applied; a second short section connected in parallel with the second ferroelectric capacitor for placing input/output terminals of the second ferroelectric capacitor in a short-circuited state when the preservation signal is applied; a first switching element connected between the first and third control terminals for switching between an on state and an off state; a second switching element connected between the second and third control terminals for switching between an on state and an off state; a third switching element connected between the first control terminal and the first ferroelectric capacitor for switching between an on state and an off state in accordance with the preservation signal; and a fourth switching element connected between the second control terminal and the second ferroelectric capacitor for switching between an on state and an off state in accordance with the preservation signal.

When the first through fourth switching elements are in off states and the third potential is applied to the third control terminal and the preservation signal is applied to the first and second short sections such that the input/output terminals of the first and second ferroelectric capacitors are in short-circuited states, programming of the switch section is performed by applying the first and second potentials at the first and second control terminals, respectively, to thereby operate the signal preservation section and by temporarily stopping the preservation signal to thereby temporarily release short-circuited states of the first and second ferroelectric capacitors and temporarily place the third and fourth switching elements into on states.

Further, when the first through fourth switching elements are in off states and the third potential is applied to the third control terminal and the preservation signal is applied to the first and second short sections such that the input/output terminals of the first and second ferroelectric capacitors are in short-circuited states, a state of the switch section recorded by programming is read out by temporarily placing the first and second switching elements into on states, and then stopping the preservation signal to thereby release short-circuited states of the first and second ferroelectric capacitors and place the third and fourth switching elements into on states and applying a potential, which is higher than the third potential, at the third control terminal to thereby operate the signal preservation section.

The first and second short sections are each formed by one of an enhancement-type field effect transistor and a depletion-type field effect transistor. Further, the first through fourth switching elements are each formed by one of an enhancement-type field effect transistor and a depletion-type field effect transistor. The circuit may also include: a first capacitor connected at one side thereof to the first control terminal and the third switching element and connected at another side thereof to earth; and a second capacitor connected at one side thereof to the second control terminal and the fourth switching element and connected at another side thereof to earth.

A third aspect of the present invention is a non-volatile semiconductor switch circuit having: a signal preservation section for preserving complementary control signals generated in accordance with a first potential and a second potential which are applied at a first control terminal and a second control terminal respectively; a switch section connected to the signal preservation section and formed by complementary transistors between a first input/output terminal and a second input/output terminal for switching between an on state and an off state in response to the control signals; a first ferroelectric capacitor connected between the first control terminal and a third control terminal for generating a polarization state in accordance with a potential difference between the first and third control terminals when a third potential is applied at the third control terminal and for preserving the polarization state after the first and third potentials have been removed; a second ferroelectric capacitor connected between the second and third control terminals for generating a polarization state in accordance with a potential difference between the second and third control terminals when the third potential is applied at the third control terminal and for preserving the polarization state after the second and third potentials have been removed; a first short section connected in parallel with the first ferroelectric capacitor for placing input/output terminals of the first ferroelectric capacitor in a short-circuited state when a preservation signal is applied; a second short section connected in parallel with the second ferroelectric capacitor for placing input/output terminals of the second ferroelectric capacitor in a short-circuited state when the preservation signal is applied; a first switching element connected between the first and third control terminals for switching between an on state and an off state; a second switching element connected between the second and third control terminals for switching between an on state and an off state; a third switching element connected between the first control terminal and the first ferroelectric capacitor for switching between an on state and an off state in accordance with a signal other than the preservation signal; and a fourth switching element connected between the second control terminal and the second ferroelectric capacitor for switching between an on state and an off state in accordance with a signal other than the preservation signal.

When the first through fourth switching elements are in off states and the third potential is applied to the third control terminal and the preservation signal is stopped such that the input/output terminals of the first and second ferroelectric capacitors are in short-circuited states, programming of the switch section is performed by applying the first and second potentials at the first and second control terminals, respectively, to thereby operate the signal preservation section and by temporarily placing the third and fourth switching elements into on states.

Further, when the first through fourth switching elements are in off states and the preservation signal is applied to the first and second short sections such that the input/output terminals of the first and second ferroelectric capacitors are in short-circuited states, a state of the switch section recorded by programming is read out by applying the third potential to the third control terminal and temporarily placing the first and second switching elements into on states, and then stopping the preservation signal to thereby release short-circuited states of the first and second ferroelectric capacitors and place the third and fourth switching elements into on states, and applying a potential, which is higher than the third potential, at the third control terminal to thereby operate the signal preservation section.

The first and second short sections are each formed by one of an enhancement-type field effect transistor and a depletion-type field effect transistor. Further, the first through fourth switching elements are each formed by one of an enhancement-type field effect transistor and a depletion-type field effect transistor. The circuit may also include a first capacitor connected at one side thereof to the first control terminal and the third switching element and connected at another side thereof to earth; and a second capacitor connected at one side thereof to the second control terminal and the fourth switching element and connected at another side thereof to earth.

Thus, the first and second short sections are connected in parallel with the first and second ferroelectric capacitors. When the first and second short sections are made to form short-circuits by application of the preservation signal, voltages between the input/output terminals of the first and second ferroelectric capacitors are close to 0 V. Thus, the risk of imprinting is removed, and polarization states can be preserved for long periods of time.

BRIEF DESCRIPTION OF THE DRAWINGS

FIG. 7 is a timing diagram showing operations at a time of programming for FIG. 6.

FIG. 8 is a timing diagram showing operations at a time of read-out for FIG. 6.

DESCRIPTION OF THE PREFERRED EMBODIMENTS

The First Embodiment

Figure 1:
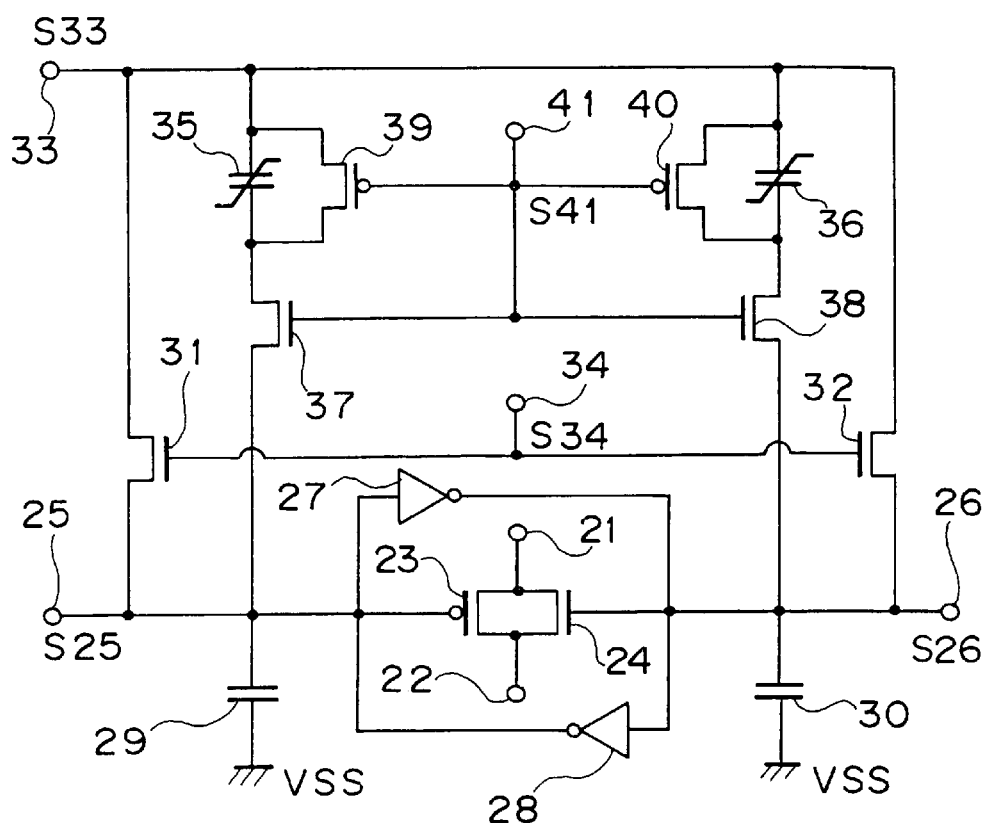
FIG. 1 is a circuit diagram showing a non-volatile semiconductor switch circuit relating to a first embodiment of the present invention.
Figure 2:
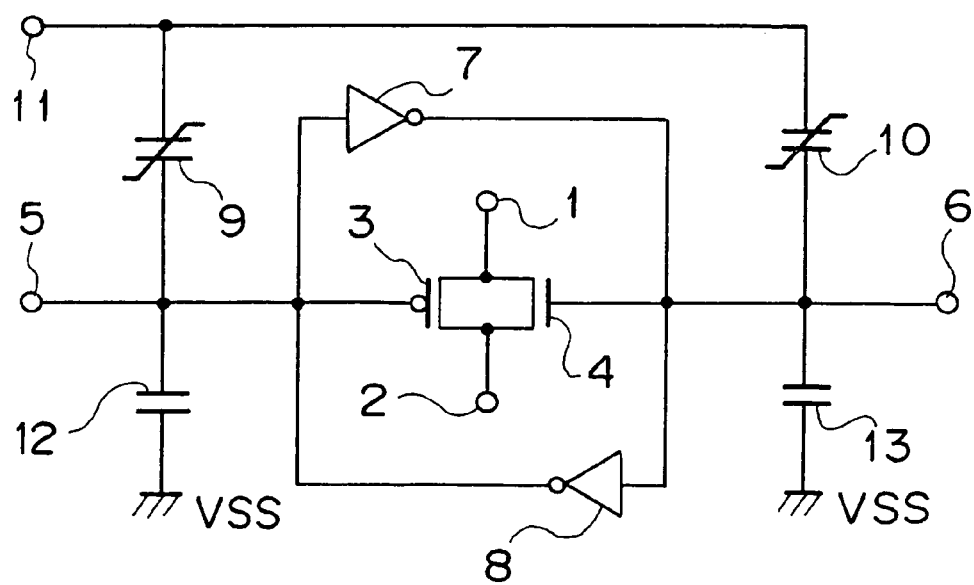
FIG. 2 is a circuit diagram of a conventional non-volatile semiconductor switch circuit.

FIG. 1 is a circuit diagram of a non-volatile semiconductor switch circuit showing the first embodiment of the present invention.

In this non-volatile semiconductor switch circuit, a switch section (for example, a PMOS 23 and an NMOS 24) is connected between input/output terminals 21 and 22. The complementary transistors, the PMOS 23 and the NMOS 24, control an ON/OFF connection condition between the input/output terminals 21 and 22. Gates of the PMOS 23 and the NMOS 24 are connected to control terminals 25 and 26 respectively.

A signal preservation section (for example, a flip-flop) formed by inverters 27 and 28 is connected at the control terminals 25 and 26. That is, an input of the inverter 27 is connected to the control terminal 25 and an output of the inverter 27 is connected to the control terminal 26, while an input of the inverter 28 is connected to the control terminal 26 and an output of the inverter 28 is connected to the control terminal 25.

The control terminals 25 and 26 are also connected to a substrate potential VSS via capacitors 29 and 30, respectively. The control terminals 25 and 26 are, in addition, connected to a control terminal 33 via NMOSs (switching elements) 31 and 32, respectively. Gates of the NMOSs 31 and 32 are connected to a terminal 34.

Figure 3:
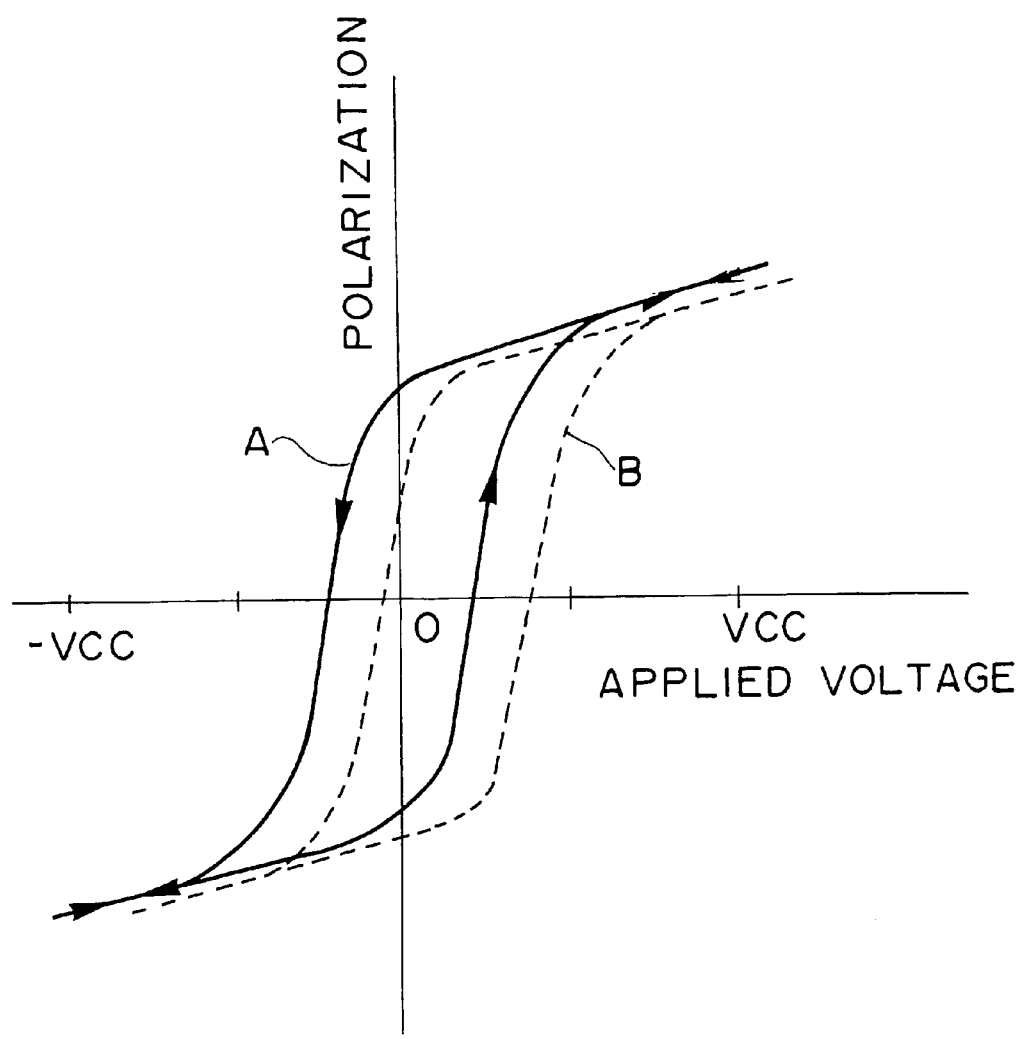
FIG. 3 is a hysteresis characteristic of a ferroelectric capacitor.

Respective one terminals of ferroelectric capacitors 35 and 36 are connected to the control terminal 33. Respective other terminals of the ferroelectric capacitors 35 and 36 are connected to the control terminals 25 and 26 via NMOSs (switching elements) 37 and 38, respectively. Hence, the ferroelectric capacitors 35 and 36 are set so as to be saturatedly polarized by an applied voltage of ±VCC/2, as shown by solid line A in FIG. 3. Respective short sections (for example, PMOSs) 39 and 40 are connected in parallel with each of the ferroelectric capacitors 35 and 36. Gates of these PMOSs 39 and 40 and of the NMOSs 37 and 38 are connected to a terminal 41.

Next, explanation of an example of operations of the switch circuit of FIG. 1 is divided into (1) operations during programming, for writing the condition of the switch circuit, and (2) operations during read-out, for reproducing an original condition when a power supply is turned on.

(1) Operations during programming

Figure 4:
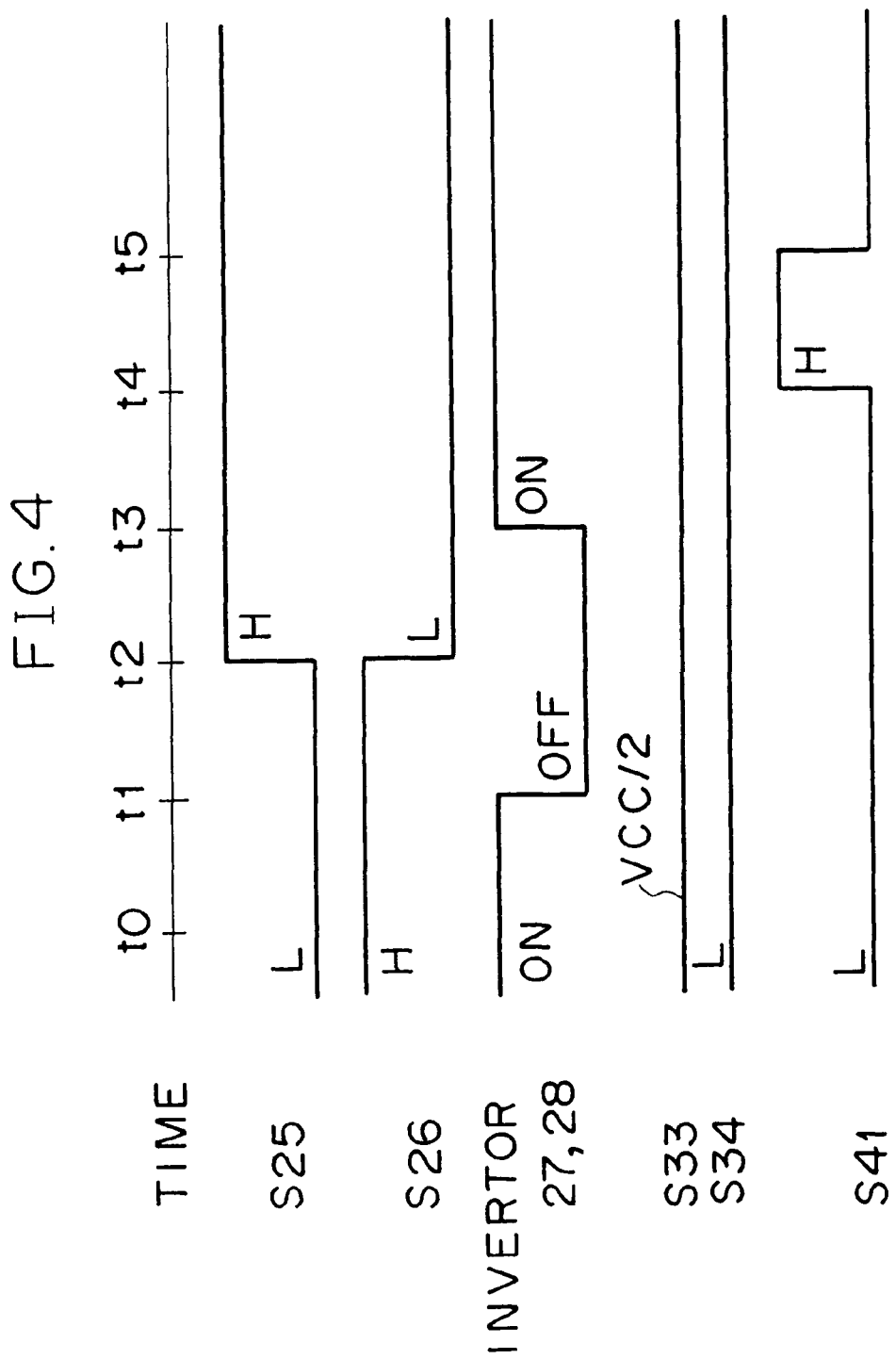
FIG. 4 is a timing diagram showing operations at a time of programming for FIG. 1.

FIG. 4 is a timing diagram showing operations during programming for FIG. 1.

At time t0 in FIG. 4, the voltage of a signal S33 at the control terminal 33 is set to VCC/2 and the voltages of signals S34 and S41 at the terminals 34 and 41 are set to "L". Hence, the NMOSs 31, 32, 37 and 38 turn off, and the control terminals 25 and 26 disconnect from the control terminal 33.

Meanwhile, the PMOSs 39 and 40 turn on, and the terminals of the ferroelectric capacitors 35 and 36 are short-circuited and held at close to 0 V. In this state, respective mutually complementary signals S25 and S26, that is, "L" and "H" signals, are applied at the control terminals 25 and 26. Hence, the PMOS 23 and the NMOS 24 turn on and there is an ON condition between the input/output terminals 21 and 22.

Now, a case in which the condition between the input/output terminals 21 and 22 is switched to an OFF condition is explained.

At time t1, a power supply to the inverters 27 and 28 is disconnected. At time t2, the signals S25 and S26 at the control terminals 25 and 26 are switched over to "H" and "L" respectively. Hence, the PMOS 23 and the NMOS 24 turn off, and there is an OFF condition between the input/output terminals 21 and 22.

At time t3, the power supply is re-applied to the inverters 27 and 28. Consequently, the "H" potential of the signal S25 and the "L" potential of the signal S26 are preserved at the flip-flop formed by the inverters 27 and 28. Subsequently, even if the signals S25 and S26 at the control terminals 25 and 26 are turned off, the OFF condition between the input/output terminals 21 and 22 will be maintained.

At time t4, the signal S41 (preservation signal) at the terminal 41 is set to "H", and the signals at the other terminals 25, 26, 33 and 34 continue unchanged. Thus, the NMOSs 37 and 38 turn on, the PMOSs 39 and 40 turn off, and the ferroelectric capacitors 35 and 36 connect to the control terminals 25 and 26, respectively. Thus, voltages of VCC/2 having mutually opposite polarities are applied to the ferroelectric capacitors 35 and 36, and the ferroelectric capacitors 35 and 36 undergo opposite polarizations.

At time t5, the signal S41 at the terminal 41 returns to "L". Thus, the NMOSs 37 and 38 turn off and the ferroelectric capacitors 35 and 36 disconnect from the control terminals 25 and 26. Also, the PMOSs 39 and 40 turn on, and the ferroelectric capacitors 35 and 36 are short-circuited in the oppositely polarized states thereof.

(2) Operations during read-out

Figure 5:
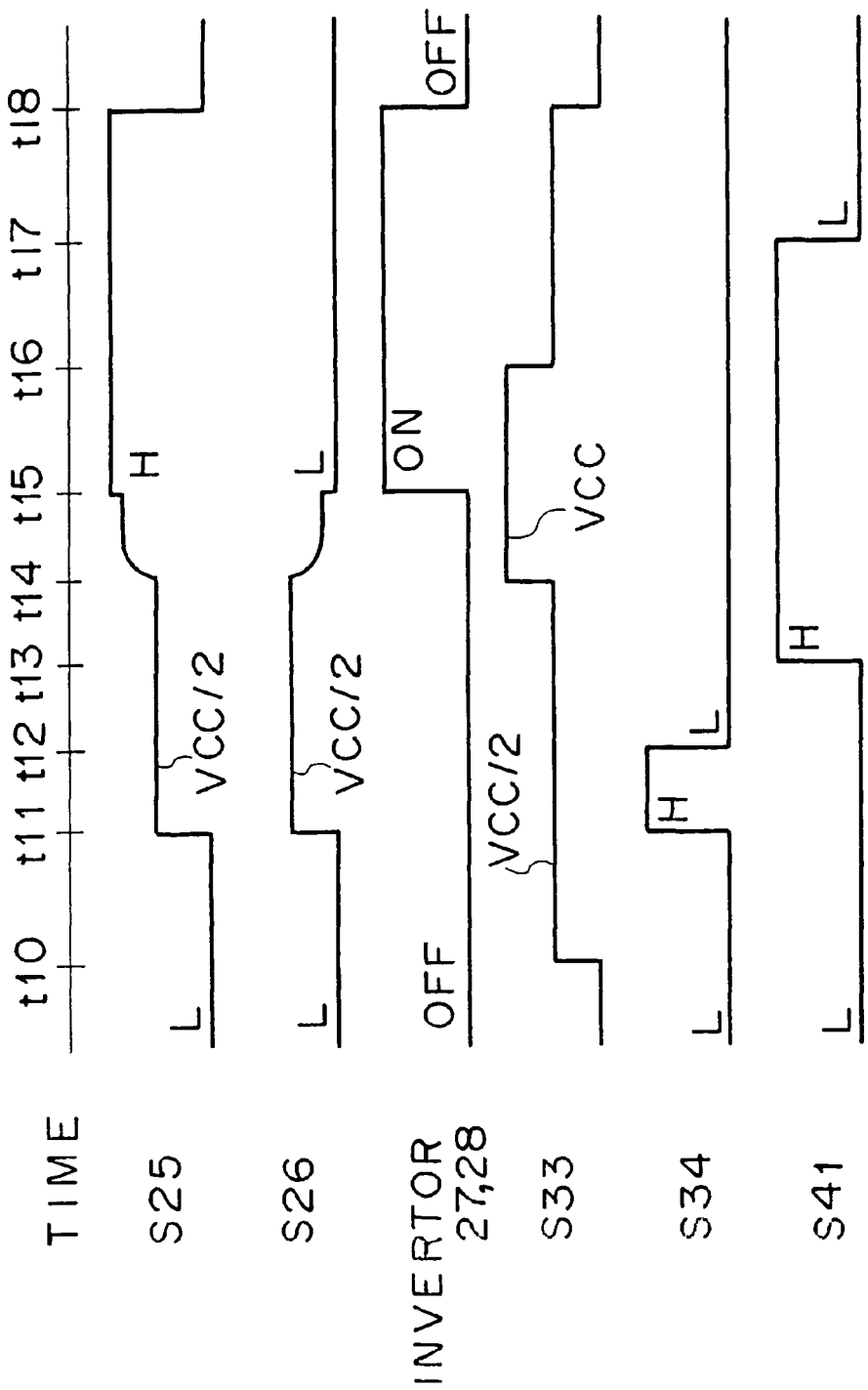
FIG. 5 is a timing diagram showing operations at a time of read-out for FIG. 1.

FIG. 5 is a timing diagram showing operations during read-out for FIG. 1.

A power supply is connected at time t10 in FIG. 5. At this time, a voltage of VCC/2 is applied as signal S33 at the control terminal 33, the control terminals 25 and 26 remain unconnected, and the signals S34 and S41 at the terminals 34 and 41 are at "L".

At time t11, the signal S34 at the terminal 34 is switched to "H". Hence, the NMOSs 31 and 32 turn on, and voltages of VCC/2 are output as the signals S25 and S26 at the control terminals 25 and 26. The VCC/2 voltages of the signals S25 and S26 charge the capacitors 29 and 30, respectively.

At time t12, the signal S34 at the terminal 34 is switched to "L". Hence, the NMOSs 31 and 32 turn off and the control terminals 25 and 26 disconnect from the control terminal 33. At this time, the signals S25 and S26 at the control terminals 25 and 26 are temporarily held at VCC/2 by the voltages across the charged capacitors 29 and 30.

At time t13, the signal S41 at the terminal 41 is switched to "H". Hence, the PMOSs 39 and 40 turn off, and the short-circuits at the ferroelectric capacitors 35 and 36 are opened. At the same time, the NMOSs 37 and 38 turn on and the ferroelectric capacitors 35 and 36 connect to the control terminals 25 and 26, respectively.

At time t14, the signal S33 at the control terminal 33 is raised to VCC. Consequently, there are movements of charge at the ferroelectric capacitors 35 and 36, in accordance with the hysteresis curve, and the charges are transferred to the capacitors 29 and 30. The ferroelectric capacitors 35 and 36 were preserving polarizations with mutually complementary polarities. Therefore, the voltages at the control terminals 25 and 26 are different and there is a potential difference having the same polarity as a potential difference that was written with at the time of programming.

At time t15, a power supply is connected to the inverters 27 and 28. Consequently, the potential difference between the control terminals 25 and 26 is amplified by the flip-flop formed by the inverters 27 and 28. Thus, the signals S25 and S26 at the control terminals 25 and 26 become "H" and "L", respectively. Hence, the PMOS 23 and the NMOS 24 turn off, and the same OFF condition between the input/output terminals 21 and 22 that was programmed previously is reproduced.

At time t16, the signal S33 at the control terminal 33 is returned to VCC/2. Consequently, the previous polarization states are rewritten to the ferroelectric capacitors 35 and 36, and the original information is preserved.

At time t17, the signal S41 at the terminal 41 is set to "L". Hence, the PMOSs 39 and 40 turn on, and the terminals of the ferroelectric capacitors 35 and 36 are short-circuited and held at close to 0 V.

At time t18, the power supply for the entire circuit is disconnected.

As described above, the non-volatile semiconductor switch circuit of the first embodiment includes the PMOSs 39 and 40 which short-circuit the terminals of the ferroelectric capacitors 35 and 36 and hold the same at close to 0 V. Thus, imprinting of the ferroelectric capacitors 35 and 36 is prevented, with the beneficial result that polarization states can be preserved for long periods of time.

The Second Embodiment

Figure 6:
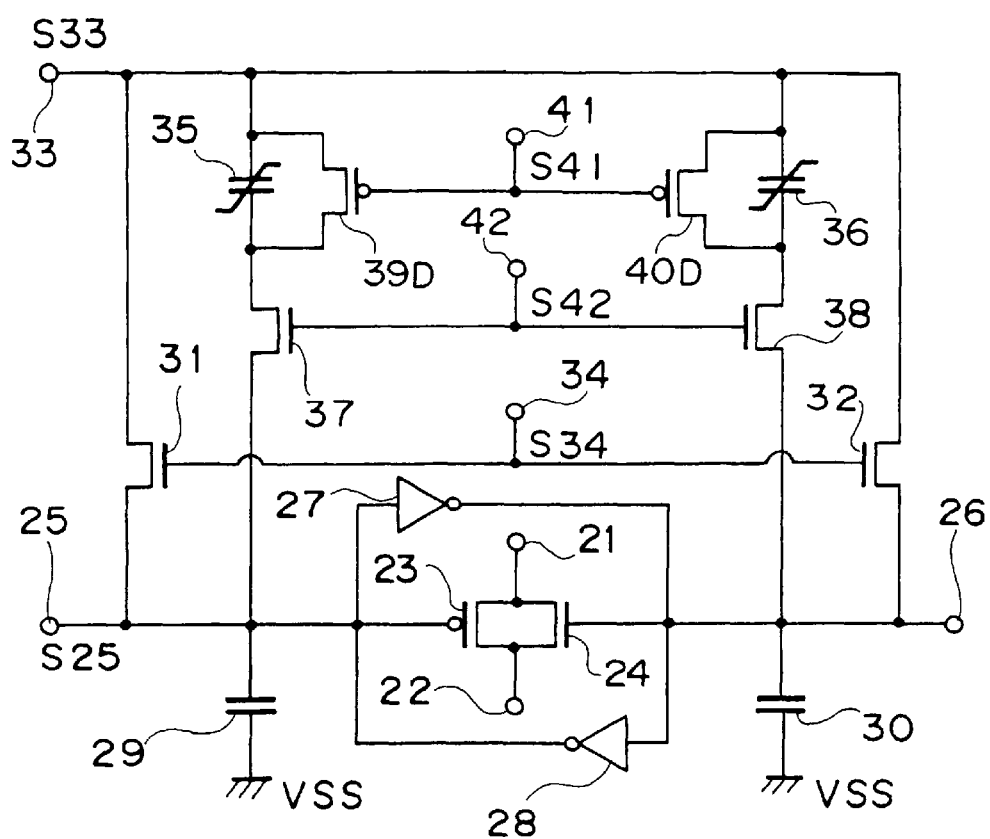
FIG. 6 is a circuit diagram showing a non-volatile semiconductor switch circuit relating to a second embodiment of the present invention.

FIG. 6 is a circuit diagram of a non-volatile semiconductor switch circuit showing the second embodiment of the present invention. Elements that are the same as in FIG. 1 have the same reference numbers applied thereto.

Differences between the non-volatile semiconductor switch circuit of this embodiment and the non-volatile semiconductor switch circuit of FIG. 1 are that depletion-type PMOSs 39D and 40D are provided in place of the PMOSs 39 and 40 and a terminal 42 for controlling the NMOSs 37 and 38 has been made separate from the terminal 41 for controlling the depletion-type PMOSs 39D and 40D. The depletion-type PMOSs 39D and 40D turn off when the gates thereof (terminal 41) are at a voltage that is higher than the sources thereof (terminal 33) by more than VCC/2. The depletion-type PMOSs 39D and 40D turn on when the gates and the sources are at about the same voltage. The structure of this circuit is otherwise the same as in FIG. 1.

Next, explanation of an example of operations of the switch circuit of FIG. 6 is divided into (1) operations during programming and (2) operations during read-out.

(1) Operations during programming

FIG. 7 is a timing diagram showing operations during programming for FIG. 6.

At time T0 in FIG. 7, the voltage of the signal S33 at the control terminal 33 is set to VCC/2 and the voltages of signals S34, S41 and S42 at the terminals 34, 41 and 42 are set to "L". Hence, the NMOSs 31, 32, 37 and 38 turn off, and the control terminals 25 and 26 disconnect from the control terminal 33. Meanwhile, the PMOSs 39D and 40D turn on, and the terminals of the ferroelectric capacitors 35 and 36 are short-circuited and held at close to 0 V. In this state, respective mutually complementary signals S25 and S26, that is, "L" and "H", are applied at the control terminals 25 and 26. Hence, the PMOS 23 and the NMOS 24 turn on and there is an ON condition between the input/output terminals 21 and 22.

Now, a case in which the condition between the input/output terminals 21 and 22 is switched to an OFF condition is explained.

At time T1, a power supply to the inverters 27 and 28 is disconnected. At time T2, the signals S25 and S26 at the control terminals 25 and 26 are switched over to "H" and "L" respectively. Hence, the condition between the input/output terminals 21 and 22 switches to OFF. At time T3, the power supply is re-applied to the inverters 27 and 28. Consequently, the "H" potential of the signal S25 and the "L" potential of the signal S26 are preserved at the inverters 27 and 28.

To store (program) the switched information, firstly, the signal S41 at the terminal 41 must be set to "H" at time T1, thereby turning off the PMOSs 39D and 40D and releasing the short circuits between the terminals of the ferroelectric capacitors 35 and 36.

At time T4, the signal S42 at the terminal 42 is set to "H". Hence, the NMOSs 37 and 38 turn on, and the ferroelectric capacitors 35 and 36 connect to the control terminals 25 and 26, respectively. Thus, voltages of VCC/2 having mutually opposite polarities are applied to the ferroelectric capacitors 35 and 36, and the ferroelectric capacitors 35 and 36 undergo opposite polarizations.

At time T5, the signal S42 at the terminal 42 returns to "L". Thus, the NMOSs 37 and 38 turn off and the ferroelectric capacitors 35 and 36 disconnect from the control terminals 25 and 26.

At time T6, the signal S41 at the terminal 41 is set to "L". Thus, the PMOSs 39D and 40D turn on and the terminals of the ferroelectric capacitors 35 and 36 are short-circuited in the oppositely polarized states thereof.

(2) Operations during read-out

FIG. 8 is a timing diagram showing operations during read-out for FIG. 6.

A power supply is connected at time T10 in FIG. 8. At this time, a voltage of VCC/2 is applied as the signal S33 at the control terminal 33.

At time T11, the signal S34 at the terminal 34 is switched to "H". Hence, the NMOSs 31 and 32 turn on, and voltages of VCC/2 are applied to the signals S25 and S26 at the control terminals 25 and 26.

At time T12, the signal S34 at the terminal 34 is switched to "L" and the signal S41 at the terminal 41 is set to "H". Hence, the control terminals 25 and 26 disconnect from the control terminal 33 and the short circuits between the terminals of the ferroelectric capacitors 35 and 36 are released.

At time T13, the signal S42 at the terminal 42 is set to "H". Hence, the NMOSs 37 and 38 turn on, and the ferroelectric capacitors 35 and 36 connect to the control terminals 25 and 26, respectively.

At time T14, the signal S33 at the control terminal 33 is raised to VCC. Consequently, there are movements of charge at the ferroelectric capacitors 35 and 36, in accordance with the hysteresis curve, and the charges are transferred to the capacitors 29 and 30. The ferroelectric capacitors 35 and 36 were preserving polarizations with mutually complementary polarities. Therefore, the voltages at the control terminals 25 and 26 are different and there is a potential difference having the same polarity as a potential difference that was written with at the time of programming.

At time T15, a power supply is connected to the inverters 27 and 28. Consequently, the potential difference between the control terminals 25 and 26 is amplified by the flip-flop formed by the inverters 27 and 28. Thus, the signals S25 and S26 at the control terminals 25 and 26 become "H" and "L", respectively. Hence, the PMOS 23 and the NMOS 24 turn off, and the same OFF condition between the input/output terminals 21 and 22 that was programmed previously is reproduced.

At time T16, the signal S33 at the control terminal 33 is returned to VCC/2. Consequently, the previous polarization states are rewritten to the ferroelectric capacitors 35 and 36, and the original information is preserved. At time T17, the signal S42 at the terminal 42 is set to "L", the NMOSs 37 and 38 turn off and the ferroelectric capacitors 35 and 36 disconnect from the control terminals 25 and 26.

At time T18, the signal S41 at the terminal 41 is set to "L". Hence, the PMOSs 39D and 40D turn on, and the terminals of the ferroelectric capacitors 35 and 36 are short-circuited and held at close to 0 V. At time T19, the power supply for the entire circuit is disconnected.

As described above, the non-volatile semiconductor switch circuit of the second embodiment includes the depletion-type PMOSs 39D and 40D which short-circuit the terminals of the ferroelectric capacitors 35 and 36 and hold the same at close to 0 V. Therefore, even when the power supply for the whole circuit is disconnected, the PMOSs 39D and 40D can stay on and short-circuit the terminals of the ferroelectric capacitors 35 and 36. Thus, imprinting of the ferroelectric capacitors 35 and 36 is prevented, with the beneficial result that polarization states can be preserved for long periods of time.

Further, the present invention is not limited to the embodiments described above, but can take various forms. Examples of variant forms include (a) and (b) as follows.

(a) PMOSs and NMOSs can be respectively replaced with NMOSs and PMOSs, in which case the applied voltages have reversed polarities.

(b) Because parasitic capacitance of wires to the control terminals 25 and 26 can be used, the capacitors 29 and 30 can be omitted.

As is described in detail above, the first embodiment includes first and second short-circuiting sections which short-circuit first and second ferroelectric capacitors when a preservation signal has been supplied. Therefore, a voltage between the terminals of each ferroelectric capacitor can be held at close to 0 V, and a condition prior to disconnection of a power supply can be assuredly preserved.

In the second embodiment, the first and second short-circuiting sections are formed by depletion-type field effect transistors. Therefore, the terminals of the ferroelectric capacitors can be short-circuited even when the power supply is disconnected, the occurrence of imprinting can be prevented, and a condition can be even more assuredly preserved.

What is claimed is:

1. A non-volatile semiconductor switch circuit comprising:
    a signal preservation section for preserving complementary control signals generated in accordance with a first potential and a second potential which are applied at a first control terminal and a second control terminal respectively;
    a switch section connected to the signal preservation section and formed by complementary transistors between a first input/output terminal and a second input/output terminal for switching between an on state and an off state in response to the control signals;
    a first ferroelectric capacitor connected between the first control terminal and a third control terminal for generating a polarization state in accordance with a potential difference between the first and third control terminals when a third potential is applied at the third control terminal and for preserving the polarization state after the first and third potentials have been removed;
    a second ferroelectric capacitor connected between the second and third control terminals for generating a polarization state in accordance with a potential difference between the second and third control terminals when the third potential is applied at the third control terminal and for preserving the polarization state after the second and third potentials have been removed;
    a first short section connected in parallel with the first ferroelectric capacitor for placing input/output terminals of the first ferroelectric capacitor in a short-circuited state when a preservation signal is applied; and
    a second short section connected in parallel with the second ferroelectric capacitor for placing input/output terminals of the second ferroelectric capacitor in a short-circuited state when the preservation signal is applied.

2. The circuit of claim 1, wherein, when the third potential is applied to the third control terminal and the preservation signal is applied to the first and second short sections such that the input/output terminals of the first and second ferroelectric capacitors are in short-circuited states, programming of the switch section is performed by applying the first and second potentials at the first and second control terminals, respectively, to thereby operate the signal preservation section and by temporarily stopping the preservation signal to thereby temporarily release short-circuited states of the first and second ferroelectric capacitors.

3. The circuit of claim 1, wherein, when the third potential is applied to the third control terminal and the preservation signal is stopped such that short-circuited states of the first and second ferroelectric capacitors are released, a state of the switch section recorded by programming is read out by applying a potential, which is higher than the third potential, at the third control terminal to thereby operate the signal preservation section.

4. The circuit of claim 1, wherein the first and second short sections are each formed by one of an enhancement-type field effect transistor and a depletion-type field effect transistor.

5. The circuit of claim 2, wherein the first and second short sections are each formed by one of an enhancement-type field effect transistor and a depletion-type field effect transistor.

6. The circuit of claim 3, wherein the first and second short sections are each formed by one of an enhancement-type field effect transistor and a depletion-type field effect transistor.

7. A non-volatile semiconductor switch circuit comprising:
    a signal preservation section for preserving complementary control signals generated in accordance with a first potential and a second potential which are applied at a first control terminal and a second control terminal respectively;
    a switch section connected to the signal preservation section and formed by complementary transistors between a first input/output terminal and a second input/output terminal for switching between an on state and an off state in response to the control signals;
    a first ferroelectric capacitor connected between the first control terminal and a third control terminal for generating a polarization state in accordance with a potential difference between the first and third control terminals when a third potential is applied at the third control terminal and for preserving the polarization state after the first and third potentials have been removed;
    a second ferroelectric capacitor connected between the second and third control terminals for generating a polarization state in accordance with a potential difference between the second and third control terminals when the third potential is applied at the third control terminal and for preserving the polarization state after the second and third potentials have been removed;
    a first short section connected in parallel with the first ferroelectric capacitor for placing input/output terminals of the first ferroelectric capacitor in a short-circuited state when a preservation signal is applied;
    a second short section connected in parallel with the second ferroelectric capacitor for placing input/output terminals of the second ferroelectric capacitor in a short-circuited state when the preservation signal is applied;
    a first switching element connected between the first and third control terminals for switching between an on state and an off state;
    a second switching element connected between the second and third control terminals for switching between an on state and an off state;
    a third switching element connected between the first control terminal and the first ferroelectric capacitor for switching between an on state and an off state in accordance with the preservation signal; and
    a fourth switching element connected between the second control terminal and the second ferroelectric capacitor for switching between an on state and an off state in accordance with the preservation signal.

8. The circuit of claim 7, wherein, when the first through fourth switching elements are in off states and the third potential is applied to the third control terminal and the preservation signal is applied to the first and second short sections such that the input/output terminals of the first and second ferroelectric capacitors are in short-circuited states, programming of the switch section is performed by applying the first and second potentials at the first and second control terminals, respectively, to thereby operate the signal preservation section and by temporarily stopping the preservation signal to thereby temporarily release short-circuited states of the first and second ferroelectric capacitors and temporarily place the third and fourth switching elements into on states.

9. The circuit of claim 7, wherein, when the first through fourth switching elements are in off states and the third potential is applied to the third control terminal and the preservation signal is applied to the first and second short sections such that the input/output terminals of the first and second ferroelectric capacitors are in short-circuited states, a state of the switch section recorded by programming is read out by temporarily placing the first and second switching elements into on states, and then stopping the preservation signal to thereby release short-circuited states of the first and second ferroelectric capacitors and place the third and fourth switching elements into on states and applying a potential, which is higher than the third potential, at the third control terminal to thereby operate the signal preservation section.

10. The circuit of claim 7, wherein the first and second short sections are each formed by one of an enhancement-type field effect transistor and a depletion-type field effect transistor.

11. The circuit of claim 7, wherein the first through fourth switching elements are each formed by one of an enhancement-type field effect transistor and a depletion-type field effect transistor.

12. The circuit of claim 7, further comprising:
a first capacitor connected at one side thereof to the first control terminal and the third switching element and connected at another side thereof to earth; and
a second capacitor connected at one side thereof to the second control terminal and the fourth switching element and connected at another side thereof to earth.

13. The circuit of claim 8, further comprising:
a first capacitor connected at one side thereof to the first control terminal and the third switching element and connected at another side thereof to earth; and
a second capacitor connected at one side thereof to the second control terminal and the fourth switching element and connected at another side thereof to earth.

14. The circuit of claim 9, further comprising:
a first capacitor connected at one side thereof to the first control terminal and the third switching element and connected at another side thereof to earth; and
a second capacitor connected at one side thereof to the second control terminal and the fourth switching element and connected at another side thereof to earth.

15. A non-volatile semiconductor switch circuit comprising:
a signal preservation section for preserving complementary control signals generated in accordance with a first potential and a second potential which are applied at a first control terminal and a second control terminal respectively;
a switch section connected to the signal preservation section and formed by complementary transistors between a first input/output terminal and a second input/output terminal for switching between an on state and an off state in response to the control signals;
a first ferroelectric capacitor connected between the first control terminal and a third control terminal for generating a polarization state in accordance with a potential difference between the first and third control terminals when a third potential is applied at the third control terminal and for preserving the polarization state after the first and third potentials have been removed;
a second ferroelectric capacitor connected between the second and third control terminals for generating a polarization state in accordance with a potential difference between the second and third control terminals when the third potential is applied at the third control terminal and for preserving the polarization state after the second and third potentials have been removed;
a first short section connected in parallel with the first ferroelectric capacitor for placing input/output terminals of the first ferroelectric capacitor in a short-circuited state when a preservation signal is applied;
a second short section connected in parallel with the second ferroelectric capacitor for placing input/output terminals of the second ferroelectric capacitor in a short-circuited state when the preservation signal is applied;
a first switching element connected between the first and third control terminals for switching between an on state and an off state;
a second switching element connected between the second and third control terminals for switching between an on state and an off state;
a third switching element connected between the first control terminal and the first ferroelectric capacitor for switching between an on state and an off state in accordance with a signal other than the preservation signal; and
a fourth switching element connected between the second control terminal and the second ferroelectric capacitor for switching between an on state and an off state in accordance with a signal other than the preservation signal.

16. The circuit of claim 15, wherein, when the first through fourth switching elements are in off states and the third potential is applied to the third control terminal and the preservation signal is stopped such that the input/output terminals of the first and second ferroelectric capacitors are in short-circuited states, programming of the switch section is performed by applying the first and second potentials at the first and second control terminals, respectively, to thereby operate the signal preservation section and by temporarily placing the third and fourth switching elements into on states.

17. The circuit of claim 15, wherein, when the first through fourth switching elements are in off states and the preservation signal is applied to the first and second short sections such that the input/output terminals of the first and second ferroelectric capacitors are in short-circuited states, a state of the switch section recorded by programming is read out by applying the third potential to the third control terminal and temporarily placing the first and second switching elements into on states, and then stopping the preservation signal to thereby release short-circuited states of the first and second ferroelectric capacitors and place the third and fourth switching elements into on states, and applying a potential, which is higher than the third potential, at the third control terminal to thereby operate the signal preservation section.

18. The circuit of claim 15, wherein the first and second short sections are each formed by one of an enhancement-type field effect transistor and a depletion-type field effect transistor.

19. The circuit of claim 15, wherein the first through fourth switching elements are each formed by one of an enhancement-type field effect transistor and a depletion-type field effect transistor.

20. The circuit of claim 15, further comprising:
a first capacitor connected at one side thereof to the first control terminal and the third switching element and connected at another side thereof to earth; and
a second capacitor connected at one side thereof to the second control terminal and the fourth switching element and connected at another side thereof to earth.

\* \* \* \* \*